US008793548B2

(12) United States Patent
Kosugi

(10) Patent No.: US 8,793,548 B2
(45) Date of Patent: Jul. 29, 2014

(54) INTEGRATED CIRCUIT, SIMULATION APPARATUS AND SIMULATION METHOD

(75) Inventor: Naoto Kosugi, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 342 days.

(21) Appl. No.: 13/048,578

(22) Filed: Mar. 15, 2011

(65) Prior Publication Data

US 2011/0320160 A1   Dec. 29, 2011

(30) Foreign Application Priority Data

Jun. 23, 2010   (JP) .................. 2010-142421

(51) Int. Cl.
*G01R 31/28* (2006.01)
*G01R 31/3181* (2006.01)
*G01R 31/3183* (2006.01)

(52) U.S. Cl.
CPC .. *G01R 31/31813* (2013.01); *G01R 31/318371* (2013.01); *G01R 31/318307* (2013.01)
USPC ......................................... 714/738; 714/724

(58) Field of Classification Search
CPC .................. G01R 31/31813; G01R 31/318371; G01R 31/318307; G01R 31/31912; G06F 11/263; G06F 17/5022; G66F 11/26
USPC ......... 714/738, 726, 741, 724, 727, 729, 744; 327/100; 345/26, 194; 708/250, 270
See application file for complete search history.

(56) References Cited

U.S. PATENT DOCUMENTS

| | | | | |
|---|---|---|---|---|
| 5,504,756 A | * | 4/1996 | Kim et al. ..................... | 714/729 |
| 6,327,687 B1 | * | 12/2001 | Rajski et al. .................. | 714/738 |
| 7,055,118 B1 | * | 5/2006 | Kamepalli et al. ............ | 716/107 |
| 7,469,372 B2 | * | 12/2008 | Nardini et al. ................ | 714/726 |
| 7,487,419 B2 | * | 2/2009 | Mukherjee et al. ........... | 714/729 |
| 7,886,263 B1 | * | 2/2011 | Thirunavukarasu et al. . | 716/136 |
| 8,055,964 B2 | * | 11/2011 | Tokunaga ...................... | 714/729 |
| 2002/0069382 A1 | * | 6/2002 | Hayashi et al. ............... | 714/715 |
| 2002/0176288 A1 | * | 11/2002 | Nozuyama .................... | 365/200 |
| 2003/0023941 A1 | * | 1/2003 | Wang et al. ........................ | 716/4 |
| 2003/0131294 A1 | * | 7/2003 | Motika et al. ................. | 714/718 |
| 2004/0133825 A1 | * | 7/2004 | Kobayashi ..................... | 714/700 |
| 2005/0097418 A1 | * | 5/2005 | Anzou et al. .................. | 714/733 |
| 2006/0236179 A1 | * | 10/2006 | Ushikubo ...................... | 714/726 |
| 2006/0273837 A1 | * | 12/2006 | Shimazaki et al. ........... | 327/202 |
| 2008/0244345 A1 | * | 10/2008 | Kato .............................. | 714/729 |
| 2009/0273383 A1 | * | 11/2009 | Takatori et al. ............... | 327/218 |
| 2011/0185244 A1 | * | 7/2011 | Mikami ......................... | 714/731 |

FOREIGN PATENT DOCUMENTS

| | | |
|---|---|---|
| JP | 02-287271 A | 11/1990 |
| JP | 05-072287 A | 3/1993 |
| JP | 2004-054329 A | 2/2004 |

* cited by examiner

*Primary Examiner* — Albert Decady
*Assistant Examiner* — Osman Alshack
(74) *Attorney, Agent, or Firm* — Arent Fox LLP

(57) ABSTRACT

The disclosed device performs a control of generating a test pattern for the delay test of LSI. The input pattern control circuit counts a cycle number of an input pattern supplied to a test object circuit, and stops supply of the input pattern to the test object circuit when the cycle number of the input pattern coincides with a certain count number. The scan control circuit receives a control signal from the input pattern control circuit, and supplies a scan shift signal to the test object circuit to shift a scan chain in the test object circuit.

10 Claims, 10 Drawing Sheets

INTEGRATED CIRCUIT, SIMULATION APPARATUS AND SIMULATION METHOD

CROSS-REFERENCE TO RELATED APPLICATION

This application is based upon and claims the benefit of priority of the prior Japanese Patent Application No. 2010-142421, filed on Jun. 23, 2010, the entire contents of which are incorporated herein by reference.

FIELD

This invention relates to an integrated circuit, a simulation apparatus and a simulation method which generate a delay test pattern for a delay test.

BACKGROUND

Semiconductor integrated circuits (hereinafter suitably referred to as "LSI") sometimes have such a defect that the delay value of the element exceeds the standard value (so-called delay fault) due to irregularity in manufacturing. Recently, the operation frequency of the synchronous digital circuit in the LSI is getting higher, and there is a tendency that the defect due to small delay fault becomes the cause of the circuit operation failure. In order to prevent such an operation failure, in the synchronous digital circuit, it is desired to execute a test (hereinafter suitably referred to as "delay test") to ensure that the circuit operates at the operation frequency actually used, for example, before the shipping.

As the technique of this kind, in case of executing the fault simulation of scan method, there is proposed a technique of activating the logic of the paths from the register to the register and testing whether or not each path can operate at the specification frequency (see. Japanese Laid-open Patent Application No. 02-287271). In addition, there is proposed a technique of specifying the path in which the delay fault is not specified, generating the test pattern capable of detecting the delay fault of those paths and confirming whether or not each path is activated (see. Japanese Laid-open Patent Application No. 2004-54329). Further, there is proposed a technique of executing delay fault simulation to the combinational part of the logic circuit by using the initial value and the transition value of each of the external input pins and the flop-flops (see. Japanese Laid-open Patent Application No. 05-72287).

However, in the above-mentioned conventional techniques, it is difficult to effectively detect the delay fault inside the LSI from outside of the LSI by using the input pattern that operates the LSI according to the actual use form.

SUMMARY

According to an aspect of an embodiment, there is provided an integrated circuit including: an input pattern control circuit which counts a cycle number of an input pattern supplied to a test object circuit, and which stops supply of the input pattern to the test object circuit when the cycle number of the input pattern coincides with a certain preset count number; and a scan control circuit which receives a control signal from the input pattern control circuit, and which supplies a scan shift signal to the test object circuit to shift a scan chain in the test object circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

An example of an embodiment will be described below with reference to the attached drawings.

Prior to describing the contents of the embodiment, the description will be given of the problem of the conventional delay test (the method of the conventional delay test will be suitably referred to as "comparative example").

Figure 1:
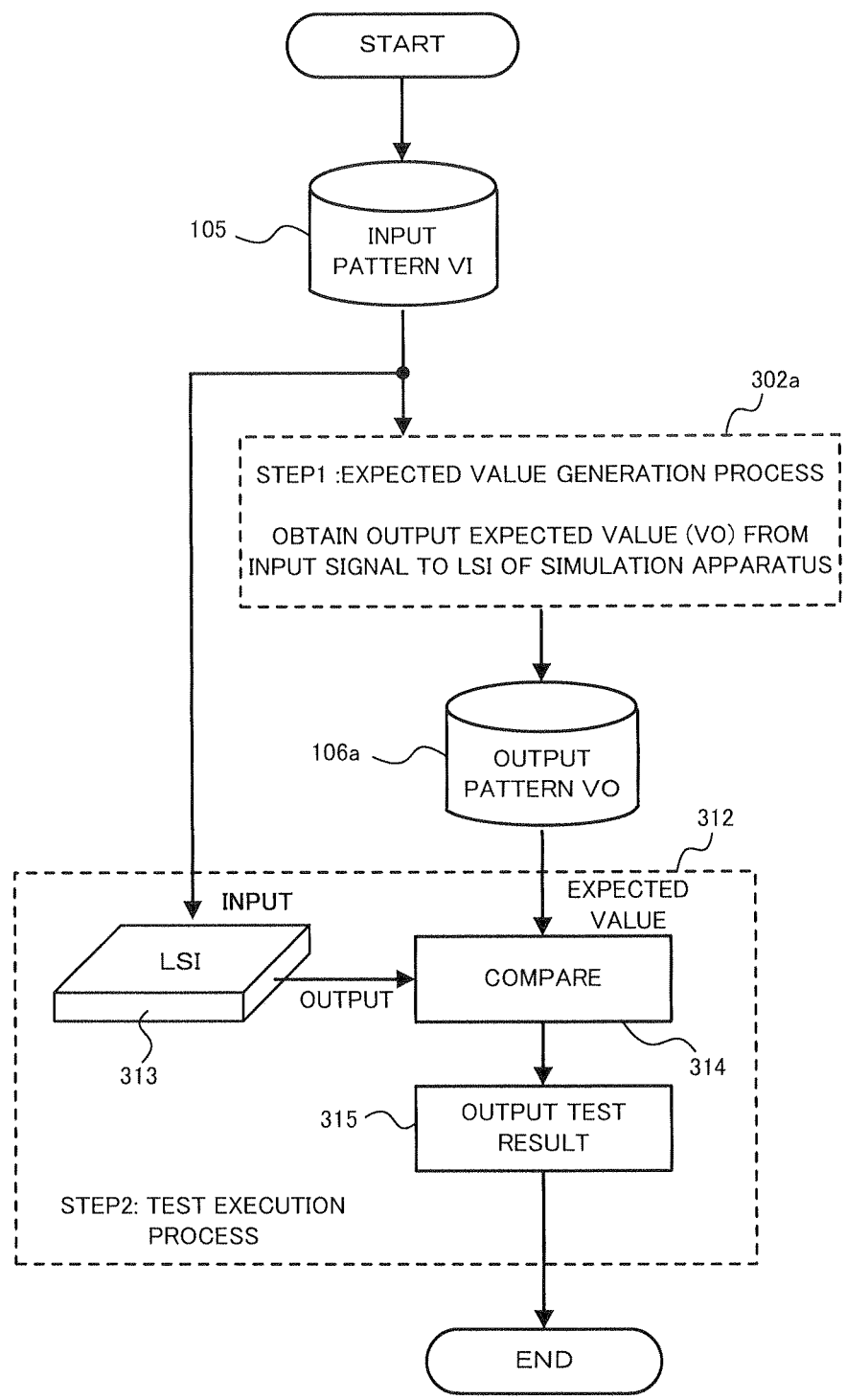
FIG. 1 illustrates a flow for executing a delay test according to a comparative example.

FIG. 1 illustrates a flow for executing the delay test according to the comparative example. As illustrated in FIG. 1, this flow includes two steps. The first step STEP1 (302a) is an expected value generation process which uses the logic simulation apparatus and applies an input pattern VI (105) to execute the logical simulation to obtain the expected value VO (106a). Namely, the first step STEP1 is the generation process of the delay test pattern. The second step STEP2 (312) is a test execution process including the step 314 which compares the output value obtained by applying the input pattern VI (105) to the actual LSI 313 with the expected value VO (106a), and the step 315 which outputs the comparison result.

Here, the characteristic and quality of the delay test is determined dependently upon what kind of pattern is inputted to obtain the expected value in the above-mentioned first step STEP1. As the method, for example, the following two kinds of methods are known (hereinafter referred to as "first comparative example" and "second comparative example", respectively).

(i) 1st comparative example:
A method of generating the test pattern using scan chain used in a logic scan test to execute the test.

(ii) 2nd comparative example:
A method of preparing the input pattern VI that operates LSI according to the actual use form and operating the LSI at the operation period of normal operation state to obtain the expected value of the output value by the logical simulation apparatus, in the first step STEP1.

Figure 2:
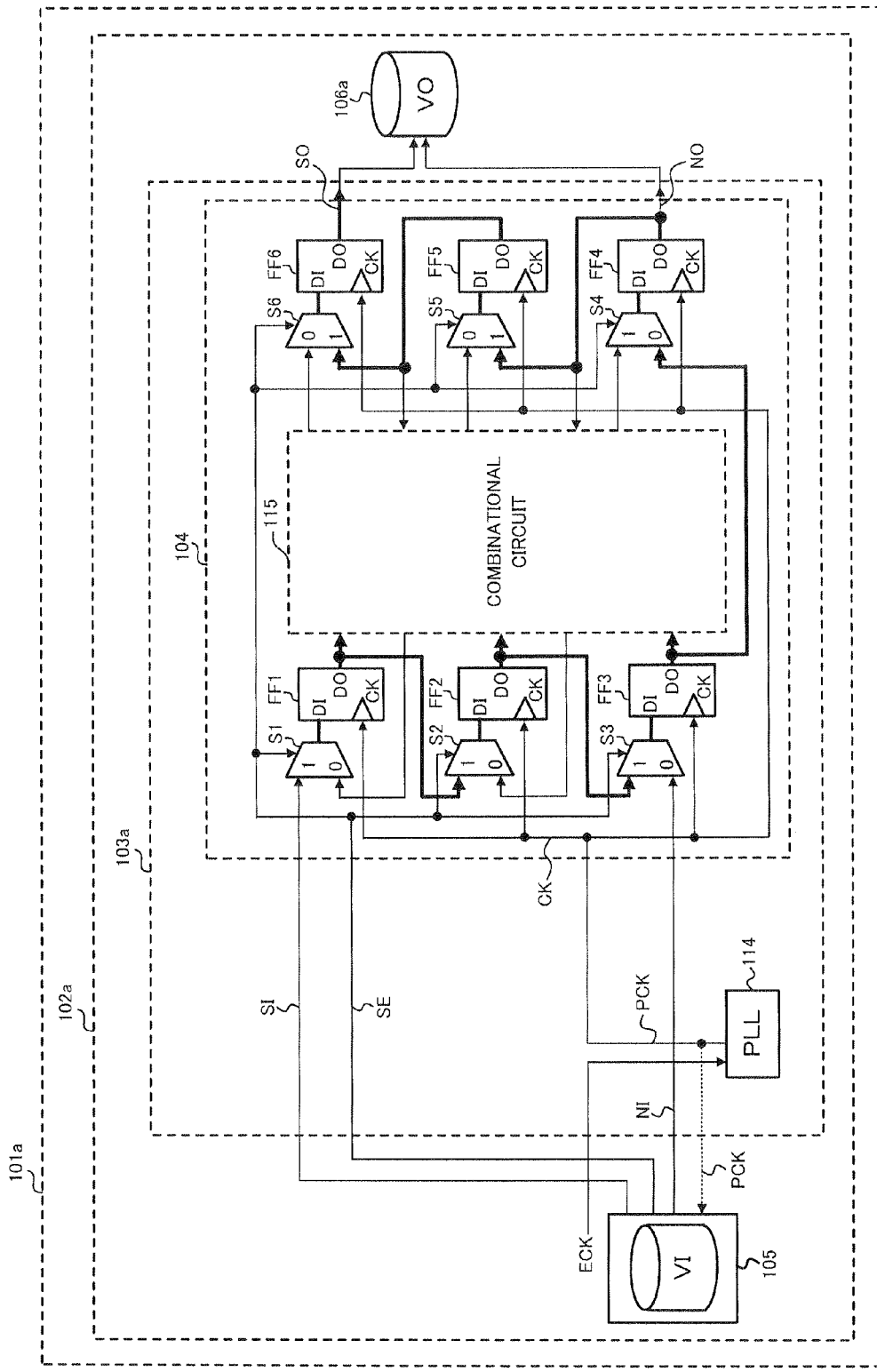
FIG. 2 is a block diagram illustrating a schematic configuration of a simulation apparatus according to a first comparative example.

With reference to FIG. 2, the method according to the first comparative example will be described. FIG. 2 is a block diagram illustrating the schematic configuration of the simulation apparatus 101a according to the first comparative example. In FIG. 2, the flow of the signal at the time of the scan operation is illustrated by the thick line.

A simulation apparatus 101a is a program that operates on a computer. A test bench 102a is a system which controls the entire simulation by using the logical simulation model of LSI, and is written by "Verilog" description, for example. The logical simulation model 103a (this model is hereinafter simply referred to as "LSI", too) is obtained by modeling the circuit information of the actual LSI to the program description operable in the logical simulation apparatus. For example, the logical simulation model 103a is written by the "Verilog" description such as a gate-level net list or RTL.

The test object circuit 104 has LSI circuits inside. For example, the test object circuit 104 has six flop-flops FF1 to FF6, six selector circuits S1 to S6, and the combinational circuit 115. The selector circuits S1 to S6 are the circuits which perform the selection of selecting the scan chain or the normal input. Here, "scan chain" means the chain of the flip-flops connecting the flip-flops in series, and corresponds to the chain of outputting the scan output signal SO from the scan input signal SI in the example of FIG. 2.

Each of the signals used in the simulation apparatus 101a will be described. The input pattern VI is supplied to the test object circuit 104 at every constant cycle. For example, the input pattern VI is able to operate each of the elements of the LSI. For example, the input pattern VI is stored in a pattern generation device, and is outputted by the pattern generation device synchronously with an internal oscillation clock PCK. The output pattern VO is the output expected value from the test object circuit 104, and is obtained by sampling the output value of the test object circuit 104 at every constant cycle. It is notes that, in this specification, the reference sign "VO" is used for both of the output pattern and the output expected value. The normal input signal NI is an input signal at the time of the normal operation, and is a signal corresponding to the input pattern VI. The normal output signal NO is an output signal at the time of the normal operation. The scan input signal SI and the scan output signal SO are the scan signals which are used only at the time of scan test.

The scan selection signal SE is the selection signal supplied to the selector circuits S1 to S6. The scan chain is selected when the scan selection signal SE is "1", and the normal operation circuit is selected when the scan selection signal SE is "0". The external input clock ECK is a clock inputted from outside of the LSI 103a. The Internal oscillation clock PCK is a clock oscillated by the PLL 114 inside the LSI 103a, and the circuits inside the LSI 103a basically operate based on this clock. The internal clock CK is a clock signal supplied to the test object circuit 104, and the internal clock CK is the same clock as the internal oscillation clock PCK in the example illustrated in FIG. 2.

The simulation apparatus 101a according to the first comparative example obtains the expected value VO by executing the operation including the following small steps (1) to (4) in the above-mentioned first step STEP1. It is assumed that the operation is executed in the order of the small steps (1), (2), (3), (4).

(1) Step which sets the scan selection signal SE to "1", and sets the value corresponding to the scan input signal SI to each of the flop-flops FF1 to FF6 in the test object circuit 104 by using the scan chain.

(2) Step which sets the scan selection signal SE from "1" to "0", and applies the first clock pulse from the internal clock CK to each of the flip-flops FF1 to FF6 to change the value of each of the flip-flops FF1 to FF6.

(3) Step which applies the second clock pulse to measure the delay fault to each of the flip-flops FF1 to FF6 by the internal clock CK, and observes the value of each of the flip-flops FF1 to FF6.

(4) Step which sets the scan selection signal from "0" to "1", and obtains the value corresponding to the scan output signal SO outputted via the scan chain as the expected value VO.

In the above operation, if the time from the first clock pulse to the second clock pulse is equal to the operation period at the time of the LSI normal operation, the value of each of the flip-flops FF1 to FF6 determined by the second clock pulse becomes the expected value of the delay test using the operation period as the standard value. This is because, if the delay fault occurs, the value of each of the flip-flops FF1 to FF6 determined by the second clock pulse becomes the different value. Therefore, the delay test for the actual LSI can be executed by using the operation pattern that uses the value corresponding to the scan input signal SI as the input value and uses the value corresponding to the scan output signal SO as the expected value.

The method according to the first comparative example can output the value of each of the flip-flops to the outside of the LSI by inserting the scan chain, the delay fault inside the LSI can be comprehensively detected. However, although the method according to the first comparative example can be applied to the synchronous digital circuit connecting the flip-flops to which the scan chain is inserted, it may not be applied to the case which does not coincide with the actual operation form of the LSI. For example, it is difficult to apply the method of the first comparative example to the following cases.

(a) When the circuit includes the border between the macro represented by a memory of RAM/ROM (hereinafter referred to as "hard macro") and the synchronous digital circuit, since the value of the circuit may not be freely set by the scan chain, it is difficult to apply the method according to the first comparative example.

(b) It is difficult to apply the method according to the first comparative example to the circuit which includes a path permitting the delay of plural cycles (hereinafter referred to as "multi cycle path") or different clocks, even if it is a synchronous digital circuit. This is because setting the timing of applying the second clock pulse becomes complicated.

(c) For example, there exist many circuits as described above in a large-scale LSI called SoC (System on Chip), including the CPU, the bus, the RAM/ROM macro and the high speed operation I/O. Therefore, it is difficult to execute the delay test according to the first comparative example to those parts.

(d) Strictly, the applied pattern is not the pattern that operates the LSI according to the actual use form, it is therefore difficult by the method according to the first comparative example to reproduce the delay fault of the specific path that occurs only during the LSI normal operation.

Next, the problem of the method according to the second comparative example will be described. Since the method according to the second comparative example executes the test by making the circuit perform the normal operation with the operation period at the time of the LSI normal operation, it has the following characteristics.

(a) The presence/absence of the delay fault inside the LSI can be confirmed for the circuit including the hard macro and/or the multi cycle path, for which the delay test is difficult by the method according to the first comparative example.

(b) The fault mode that occurs only during the use of the LSI can be strictly reproduced.

On the other hand, in the method according to the second comparative example, when the delay fault occurs inside the LSI, the flip-flop value in the test object circuit due to the occurrence of the delay fault desires to be transmitted such that the change of the expected value appears on the LSI output terminal. However, in the large-scale LSI including the CPU, the bus, the RAM/ROM macro and the high speed operation I/O, the number of terminals that can be used at the time of the test is considerably small with respect to the circuit scale. Therefore, in the method according to the second comparative example, even if the delay fault occurs inside the LSI, it is difficult to transmit it to the outside of the LSI as the change appearing on the output terminal.

[Simulation Apparatus]

Next, the simulation apparatus according to the embodiment will be described.

Figure 3:
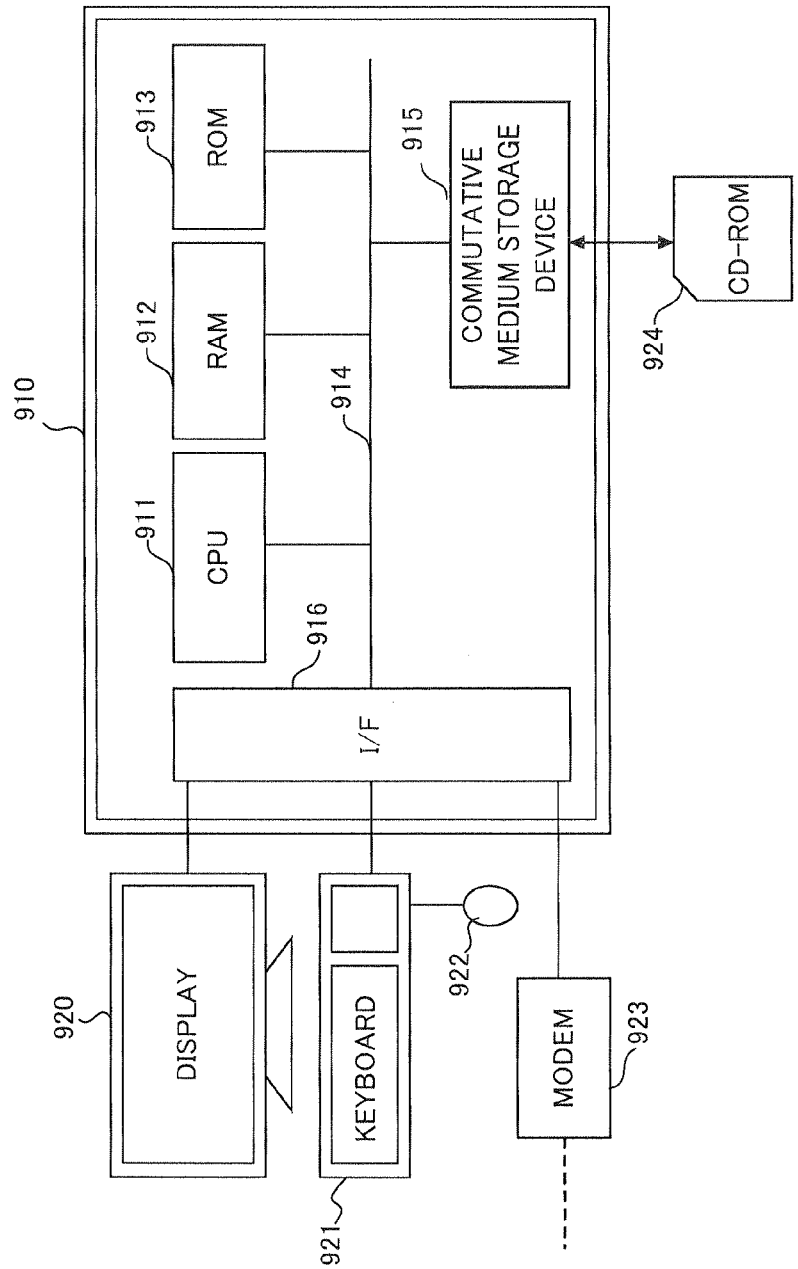
FIG. 3 is a block diagram illustrating a hardware configuration example of a computer configuring a simulation apparatus according to an embodiment.

FIG. 3 is a block diagram illustrating a hardware configuration example of a computer 910 configuring the simulation apparatus according to the embodiment. For example, this computer 910 can generate RTL design data and net list design data by CAD (Computer Aided Design) to execute the simulation.

A CPU 911, a RAM 912, a ROM 913, a commutative medium storage device 915 and an external interface 916 are connected to a bus 914.

The CPU 911 executes processing and arithmetic operation of data, and controls the above-mentioned units connected via the bus 914. In the ROM 913, a boot program is stored in advance. When the CPU 911 executes this boot program, the computer 910 is activated. Computer programs are stored in a harddisk not illustrated, and the computer programs are copied to the RAM 912 and are executed by the CPU 911. The computer 910 can execute the simulation for the delay test described later by executing the computer program.

The commutative medium storage device 915 operates a medium 924 such as a CD-ROM or a Floppy (Registered Trademark) disk. The external interface 916 connects the inside and the outside of the computer 910, and can input and output the computer program and the RTL design data to and from the network. A display 920 performs the output display from the computer 910, and a keyboard 921 and a mouse 922 are used to input information to the computer 910. A modem 923 connects to the network via a LAN or a telephone line.

This embodiment can be realized by the computer 910 executing the program. A means for supplying the program to the computer 910, e.g., a computer-readable storage medium such as CD-ROM on which the program is recorded, or a transmission medium such as the Internet that transmits the program, can be applied as the embodiment. A computer program product such as a computer-readable storage medium on which the above program is recorded can be applied as the embodiment. The program, the storage medium, the transmission medium and the computer program described above belong to the category. As the storage medium, a flexible disk, a hard disk, an optical disc, a magneto-optical disc, a CD-ROM, a magnetic tape, a non-volatile memory card and a ROM can be used, for example.

Figure 4:
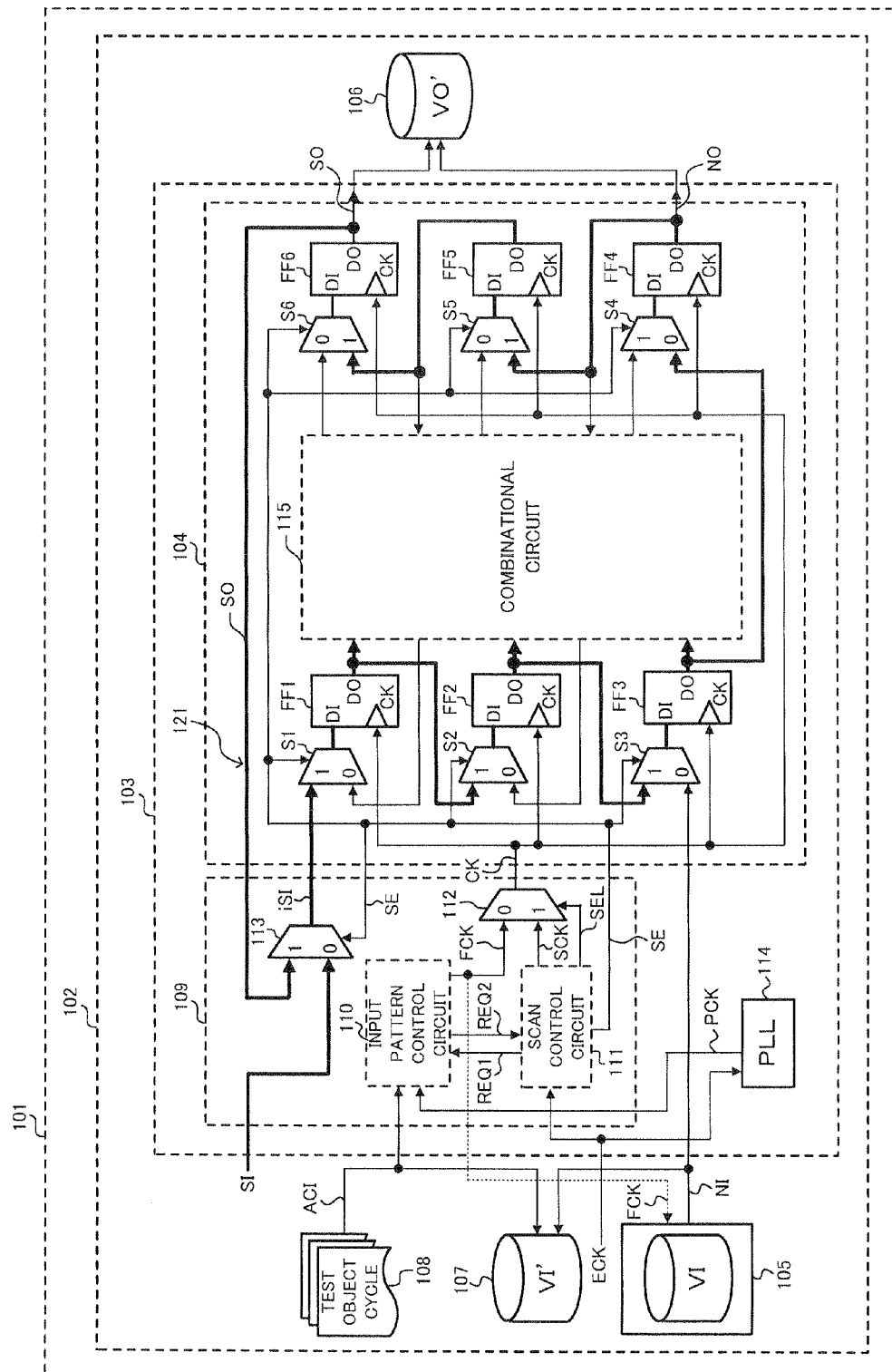
FIG. 4 is a block diagram illustrating a schematic configuration of the simulation apparatus according to the embodiment.

FIG. 4 is a block diagram illustrating a schematic configuration of a simulation apparatus 101 according to the embodiment.

The simulation apparatus 101 is different from the simulation apparatus 101a according to the above-described first comparative example in that it has a control circuit 109 in the logical simulation model 103 of LSI (the model will be hereinafter simply referred to as "LSI"). It is noted that the elements and the signals attached with the same reference signs as those of the above simulation apparatus 101a have the same meaning, and the description thereof will be omitted. In addition, the elements and the signals which is not particularly explained are the same as those of the simulation apparatus 101a. In FIG. 4, the flow of the signal during the scan operation (in other words, "scan shift operation", similarly used below) is illustrated by the thick line.

The control circuit 109 includes an input pattern control circuit 110, a scan control circuit 111, a clock selection circuit 112 and a scan input selection circuit 113.

The input pattern control circuit 110 controls the clock signal to the inside of the LSI 103. For example, the input pattern control circuit 110 receives the internal oscillation clock PCK and supplies the normal operation clock FCK corresponding to the internal oscillation clock PCK to the clock selection circuit 112. In this case, the input pattern control circuit 110 counts the cycle number at the time of applying the existing input pattern VI to the test object circuit 104, and generates the normal operation clock FCK based on the cycle number. For example, the input pattern control circuit 110 outputs the internal oscillation clock PCK as the normal operation clock FCK until the cycle number being counted coincides with a test object cycle ACI stored in a test object cycle storage unit 108. The test object cycle ACI is the cycle which performed the path operation to be the observation object of the delay test, namely, the cycle at which the observation object path is activated. For example, the test object cycle ACI corresponds to the operation period at the time of the LSI normal operation. The test object cycle storage unit 108 stores plural test object cycles ACI as a list.

The input pattern control circuit 110 outputs the normal operation clock FCK produced by clock-gating the internal oscillation clock PCK, when the cycle number being counted coincides with the test object cycle ACI. By clock-gating the internal oscillation clock PCK in this way, the supply of the clock to the test object circuit 104 is stopped. In addition, since the input pattern VI is read out from the pattern generation device synchronously with the normal operation clock FCK, by clock-gating the internal oscillation clock PCK, the application of the input pattern VI to the test object circuit 104 is stopped, and the associated operation in the test object circuit 104 is stopped.

In addition, the input pattern control circuit 110 stops the counting of the cycle number and supplies the scan operation request signal REQ2 to the scan control circuit 111, when the cycle number of the existing input pattern VI coincides with the test object cycle ACI as described above. The scan operation request signal REQ2 is a request signal to make the scan control circuit 111 execute the scan operation and to make the cycle counter of the scan control circuit 111 operate again.

The scan control circuit 111 controls the operation of shifting the scan chain (i.e., scan operation) in the test object circuit 104 to output the value of each of the flip-flops FF1 to FF6 to outside the LSI 103 as the scan output signal SO. For example, the scan control circuit 111 generates the scan clock SCK and the scan selection signal SE, when the scan operation request signal REQ2 is supplied from the input pattern control circuit 110. The scan clock signal SCK is the clock used at the time of the scan operation, and is the clock slow enough to enable easy access from the outside of the LSI 103. The scan selection signal SE is the selection signal supplied to the selector circuits S1 to S6. The scan control circuit 111 sets the scan selection signal SE to "1" when the scan operation request signal REQ2 is supplied, and sets the scan selection signal SE to "0" when the scan operation request signal REQ2 is not supplied. In this case, the scan chain is selected when the scan selection signal SE is "1", and the normal operation circuit is selected when the scan selection signal SE is "0".

In addition, the scan control circuit 111 supplies the clock selection signal SEL to the clock selection circuit 112. The clock selection signal SEL is a signal to select one of the normal operation clock FCK and the scan clock SCK. The scan control circuit 111 sets the clock selection signal SEL to "1" when the scan operation request signal REQ2 is supplied (i.e., at the time of the scan operation), and sets the clock selection signal SEL to "0" when the scan operation request signal REQ2 is not supplied (i.e., at the time of applying the existing input pattern VI). The clock selection circuit 112 selects the scan clock SCK when the clock selection signal SEL is "1", and selects the normal operation clock FCK when the clock selection signal SEL is "0". Then, the clock selection circuit 112 supplies the selected signal to the test object circuit 104 as the internal clock CK. It is preferred to control such that small pulses are not generated at the time of changing the clock selection signal SEL.

In addition, the scan control circuit 111 controls the operation of shifting the scan chain in the test object circuit 104 in accordance with the length of the scan chain in the test object circuit 104. For example, the scan control circuit 111 performs the control of applying the scan clock SCK to the test object circuit 104 for the cycles corresponding to the length of the scan chain. In detail, the scan control circuit 111 applies the scan clock SCK for the cycles determined based on the number of the flip-flops FF and the number of the scan chains. In the example illustrated in FIG. 4, there are six flip-flops and one scan chain, the scan control circuit 111 applies the scan clock SCK for six cycles.

Then, when the scan control circuit 111 applies the scan clock SCK for that cycle, it sets the scan selection signal SE to "0" and supplies the cycle counter operation request signal REQ1 to the input pattern control circuit 110. The cycle counter operation request signal REQ1 is a request signal to make the cycle counter of the input pattern control circuit 110 operate again. When the cycle counter operation request signal REQ1 is supplied to the input pattern control circuit 110 in this way, the input pattern control circuit 110 restarts the application of the existing input pattern VI to the test object circuit 104, and restarts the associated operation in the test object circuit 104.

To the scan input selection circuit 113, the scan selection signal SE and the normal scan input signal SI described above are supplied, and the scan output signal SO is supplied via the scan chain circulation circuit 121. The scan input selection circuit 113 selects one of the scan input signal SI and the scan output signal SO in accordance with the scan selection signal SE, and supplies the selected signal to the test object circuit 104 as the scan input signal iSI. For example, the scan input selection circuit 113 selects the scan output signal SO when the scan selection signal SE is "1", and selects the scan input signal SI when the scan selection signal SE is "0". Namely, the scan input selection circuit 113 performs the operation of returning the scan output signal SO to the flip-flops FF1 to FF6 as the scan input signal iSI at the time of the scan operation. By the scan input selection circuit 113 and the scan chain circulation circuit 121, after the shift of the scan chain, the values of the flip-flops FF1 to FF6 in the test object circuit 104 can be returned to the state before stopping the normal operation. In the simulation apparatus 101, a fixed value can be used as the scan input signal SI, for example.

When the logical simulation is executed by using the above-described simulation apparatus 101, by the operation of the input pattern control circuit 110 and the scan control circuit 111, an operation different from the case in which the existing input pattern VI is simply applied is performed. For example, by recording the values of the input signal NI and the output signal SO of the LSI 103 at the time of the logical simulation by the simulation apparatus 101, the modified new input pattern VI' and new output pattern (output expected value) VO' are obtained. Namely, the new input pattern VI' and the new output pattern VO' are obtained as the delay test pattern. The new input pattern VI' is obtained by sampling the input value (input signal NI) to the LSI 103 at every constant cycle, and corresponds to the input pattern VI held by the operation of the input pattern control circuit 110.

While FIG. 4 illustrates the configuration in that both the input pattern control circuit 110 and the scan control circuit 111 are implemented in the inside of the LSI 103, a part of them may be implemented on the test bench 102. The test object circuit 104 actually includes various macro configuring the circuit of memory macro such as RAM and ROM, in addition to the flip-flops FF1 to FF6, the selector circuits S1 to S6 and the combinational circuit 115. While FIG. 4 illustrates only one combinational circuit 115 and only six flip-flops FF1 to FF6, there are many combinational circuits and the flip-flops in actuality. While FIG. 4 illustrates only one normal input signal NI, only one normal output signal NO, only one scan input signal SI and only one scan output signal SO, there are plural signals in actuality. While FIG. 4 illustrates the internal clock CK of only one system, there are plural systems in actuality. It is not limited to configure the flip-flop and the selector circuit separately, and the flip-flop and the selector circuit may be configured integratedly.

[Configuration Example of Input Pattern Control Circuit and Scan Control Circuit]

Next, with reference to FIG. 5, the configuration example of the input pattern control circuit 110 and the scan control circuit 111 in the above-described simulation apparatus 101 will be described.

The input pattern control circuit 110 includes a cycle counter 201, a comparator 202 and a clock gating (CG) 203. The cycle counter 201 counts the cycle number in the test object circuit 104, i.e., the cycle number during the application of the existing input pattern VI. For example, the cycle counter 201 performs the operation of incrementing the cycle counter value by one every time it detects the internal oscillation clock PCK after the reset.

The comparator 202 compares the value of the test object cycle ACI designated in advance, with the cycle counter value of the cycle counter 201. The comparator 202 outputs the scan operation request to the scan control circuit 111, for example, supplies the scan operation request signal REQ2 to the scan control circuit 111, when the value of the test object cycle ACI coincides with the cycle counter value. In addition, at this time, the comparator 202 outputs the clock stop request to the clock gating 203 and outputs the counter stop request to the cycle counter 201. When the comparator 202 outputs the clock stop request, the clock gating 203 clock-gates the internal oscillation clock PCK to generate the normal operation clock ECK. The clock gating 203 supplies the generated normal operation clock FCK the clock selection circuit 112. By the operation of the input pattern control circuit 110 as described above, the application of the input pattern VI to the test object circuit 104 is stopped, and the associated operation of the test object circuit 104 is stopped.

The scan control circuit 111 includes a scan operation generation circuit 205 and a chain length information storage unit 206. The chain length information storage unit 206 stores the information relating to the number of the flip-flops connected as one scan chain in the test object circuit 104 (hereinafter referred to as "scan chain length information SLI"). When the scan operation request signal REQ2 is supplied, the scan operation generation circuit 205 generates the scan clock SCK based on the scan chain length information SLI, sets the scan selection signal SE to "1" and sets the clock selection signal SEL to "1". In this case, the scan operation generation circuit 205 generates the scan clock SCK for the cycle number corresponding to the scan chain information SLI. The scan chain operation generation circuit 205 supplies the scan clock SCK and the clock selection signal SEL to the clock selection circuit 112, and supplies the scan selection signal SE to the selector circuits S1 to S6 and the scan input selection circuit 113. By the operation of the scan operation generation circuit 205 as described above, the scan clock SCK is applied to the test object circuit 104 for the cycles corresponding to the scan chain length in the test object circuit 104.

Then, the scan control circuit 111 sets the scan selection signal SE to "0" and outputs the counter reactivation request to the cycle counter 201 in the input pattern control circuit 110 when it applies the scan clock SCK for the cycles corresponding to the scan chain length. For example, the scan control circuit 111 supplies the cycle counter operation request signal RE1 to the cycle counter 201. By this, the cycle counter 201 in the input pattern control circuit 110 restarts the counting of the cycle number. In addition, the input pattern control circuit 110 restarts the application of the existing input pattern VI to the test object circuit 104 and restarts the associated operation in the test object circuit 104, when the cycle counter operation request signal REQ1 is supplied.

[Flow of Delay Test]

Figure 6:
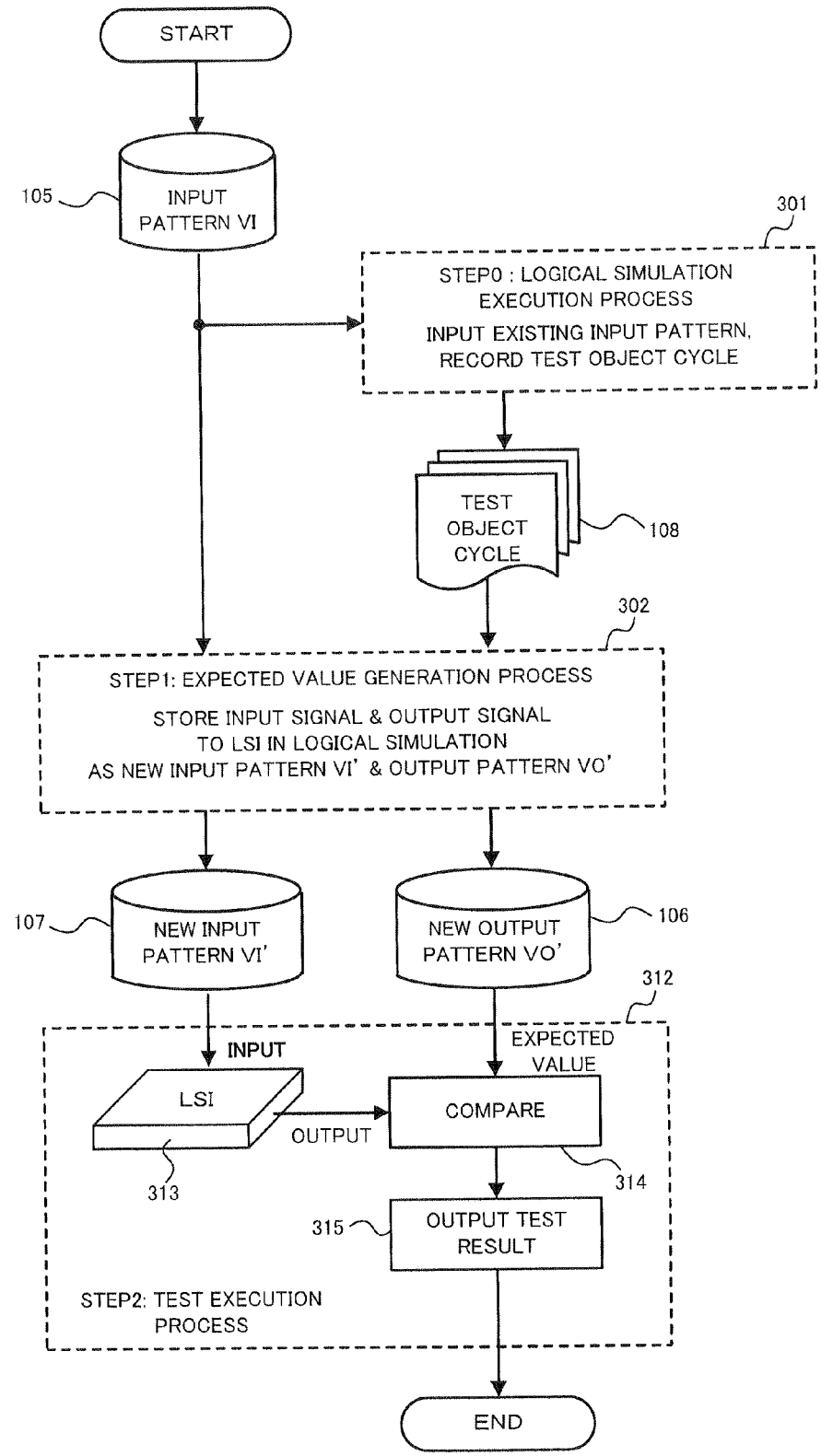
FIG. 6 illustrates a flow for executing a delay test according to the embodiment.

Next, with reference to FIG. 6, the flow of the delay test by the above-described simulation apparatus 101 will be described.

The step STEP0 (301) prior to the first step STEP1 (302) is a logical simulation execution process. For example, in the step STEP0, the simulation apparatus 101 executes the logical simulation using the existing input pattern VI which operates the LSI according to the actual use form, and investigates and records the cycle (the test object cycle ACI) which performed the path operation subject to the verification. In this case, the simulation apparatus 101 records at least one test object cycle ACI as a list. One example is a method of recording the cycle counter value of the cycle counter 201 as the test object cycle ACI by visually observing the obtained waveform (i.e., the manual observation by waveform observation) at time of executing the logical simulation. Another example is a method of detecting the signal operation in the test object circuit 104 (i.e., the signal operation observation by the test bench) at the time of executing the logical simulation and recording the cycle counter value of the cycle counter 201 at that time as the test object cycle ACI. While the activation of the verification object path is detected based on the test object cycle in the above description, the activation of the verification object path may be detected based on the simulation time, instead of using cycle.

Subsequently, the first step STEP1 (302) is an expected value generation process. In other words, it is the process to obtain the input pattern VI' and output pattern (output expected value) VO' as the delay test pattern. For example, in the first step STEP1, the simulation apparatus 101 executes the logical simulation by using the existing input pattern VI and the test object cycle ACI obtained in the prior step STEP0. Then, at the time of executing the logical simulation, the simulation apparatus 101 obtains the new input pattern VI' by sampling the value of the input signal NI of the LSI 103 and obtains the new output expected value VO' by sampling the value of the output signal SO. The detail of the first step STEP1 will be described later.

Subsequently, the second step STEP2 (312) is a test execution process. For example, in the second step STEP2, the simulation apparatus 101 obtains the output value by applying the new input pattern VI' obtained in the first step STEP1 to the actual LSI 313, and executes the test of the LSI 313 by comparing the output value with the expected value VO'. As the second step STEP2, other than the method described here, a generally known test method can be applied.

Next, with reference to FIG. 7, the flow illustrating the detail of the first step STEP1 will be described.

The step STEP1-1 (303) is an existing input pattern execution process which inputs the existing input pattern VI to the test object circuit 104. For example, the simulation apparatus 101 first stores the test object cycle ACI recorded in the above step STEP0 (step 304), and executes the input of the existing input pattern VI to the test object circuit 104 (step 305). Then, when the existing input pattern VI is ended (step S306; Yes), the simulation apparatus 101 ends the logical simulation. Namely, the simulation apparatus 101 ends the first step STEP1.

On the contrary, when the existing input patter VI is not ended (step 306; No), the input pattern control circuit 110 in the simulation apparatus 101 determines whether or not the cycle counter value (hereinafter expressed by "i") of the cycle counter 201 coincides with the value of the test object cycle ACI (hereinafter expressed by "m") (step S307). When the cycle counter value i coincides with the test object cycle value m (step 307; Yes), the process goes to step STEP1-2 (308). In this case, the input pattern control circuit 110 supplies the scan operation request signal REQ2 to the scan control circuit 111. On the contrary, when the cycle counter value i does not coincide with the test object cycle value m (step 307; No), the process returns to step 305 and goes to the operation of next cycle (i=i+1).

Subsequently, in the step STEP102 (308), the input pattern control circuit 110 temporarily stops the input of the existing input pattern VI, and maintains the input pattern VI. Namely, the input pattern control circuit 110 stops the normal operation of the test object circuit 104.

Subsequently, in the step STEP1-3 (309), the scan control circuit 111 in the simulation apparatus 101 sets the scan selection signal SE to "1" and applies the scan clock SCK to the test object circuit 104, thereby to execute the scan operation. In this case, the scan control circuit 111 determines whether or not the cycle number for the applied scan clock SCK (hereinafter expressed by "j") reaches the cycle number corresponding to the scan chain length information SLI (hereinafter expressed by "n") (step 310) When the cycle number j does not reach the cycle number n (step 310; No), the process returns to step 310 to go to the next cycle (j=j+1). By executing this determination, it is possible to apply the scan clock SCK for the cycles corresponding to the scan chain length in the test object circuit 104, thereby to output the values of the flip-flops FF1 to FF6 to the outside of the LSI 103 as the scan output signal SO.

In addition, in the step STEP1-3, the simulation apparatus 101 returns the scan output signal SO to the flip-flops FF1 to FF6 as the scan input signal ISI by the scan input selection circuit 113 and the scan chain circulation circuit 121. By this, after the shift of the scan chain, the values of the flip-flops FF1 to FF6 can be returned to the state before stopping the normal operation. Therefore, the processing of the first step STEP1 for the next test object cycle ACI can be immediately performed. Therefore, the processing of the first step STEP1 relating to all the test object cycles ACI stored in the test object cycle storage unit 108 can be efficiently performed.

When the cycle number j reaches the cycle number n (step 310; Yes), the process goes to the step STEP1-4 (311). In this case, the scan control circuit 111 sets the scan selection signal SE to "0", and supplies the cycle counter operation request signal REQ1 to the input pattern control circuit 110. Then, in the step STEP1-4, the input pattern control circuit 110 restarts the supply of the existing input pattern VI.

Thereafter, returning to the step STEP1-1, the simulation apparatus 101 performs the above-described processing once again. For example, the simulation apparatus 101 repeatedly executes the processing of the steps STEP1-1 to STEP104 until the existing input pattern VI ends (see. the determination in step 306). For example, the simulation apparatus 101 repeatedly executes the processing for the number of the list of the test object cycle ACI stored in the test object cycle storage unit 108. At the time of executing the above-described step STEP1, the simulation apparatus 101 records the values of the input signal NI and the output signal SO of the LSI 103 to obtain the new input pattern VI' and the new output expected value VO' modified. Namely, the simulation apparatus 101 obtains the new input pattern VI' and the new output expected value VO as the delay test pattern.

When this flow is executed and the test of the actual LSI 313 is performed by using the new input pattern VI', it becomes the logical simulation of operating the LSI 313 according to the actual use form, similarly to the case of using the existing input pattern VI. In this case, the value of each of the flip-flops FF1 to FF6, at the cycle at which the value (cycle) m of the test object cycle ACI coincides with the cycle counter value i of the cycle counter 201, is outputted as the scan output signal SO.

Here, the value of the outputted scan output signal SO corresponds to the value of each of the flip-flops FF1 to FF6 at the cycle "m". If the output value of the actual LSI 313 does not coincide with the expected value VO' in the above second step STEP2, it indicates that the correct value may not be stored in each of the flip-flops FF1 to FF6 at the cycle "m". Namely, it is understood that there occurs a fault due to some kind of delay in the normal operation from the cycle "m−1" to the cycle "m". Therefore, according to this embodiment, the delay fault between the cycle "m−1" to the cycle "m" can be appropriately detected. Namely, according to this embodiment, it is possible to generate the delay pattern by which the delay fault occurring between the cycle "m−1" to the cycle "m" can be appropriately detected.

[Effect of Embodiment]

As described above, the simulation apparatus 101 according to this embodiment generates the new input pattern VI' and the new output expected value VO' based on the existing operation pattern for performing the normal operation at the operation time period at the time of the LSI normal operation, and executes the delay test. Therefore, according to this embodiment, the following characteristic is obtained similarly to the above-described second comparative example.

It is possible to confirm the presence/absence of the delay fault inside the LSI for the circuit, which includes the hard macro or the circuit including the multi cycle path and for which the delay test is difficult to perform by the method of the first comparative example.

On the other hand, in this embodiment, different from the second comparative example, the value of the flip-flops FF1 to FF6 at the specific cycle "m" can be outputted as the scan output signal SO. Therefore, according to this embodiment, in comparison with the second comparative example, even when the delay fault occurs inside the LSI, it can be appropriately transmitted to the outside of the LSI as the change on the output terminal. Therefore, according to this embodiment, in comparison with the second comparative example, it is possible to effectively detect the delay fault inside the LSI at the outside of the LSI, with the input pattern that operates the LSI according to the actual use form.

[Example of Circuit Configuration]

Next, an example of the circuit of the input pattern control circuit 110 and the scan control circuit 111 described above will be described with reference to FIG. 8.

Figure 5:
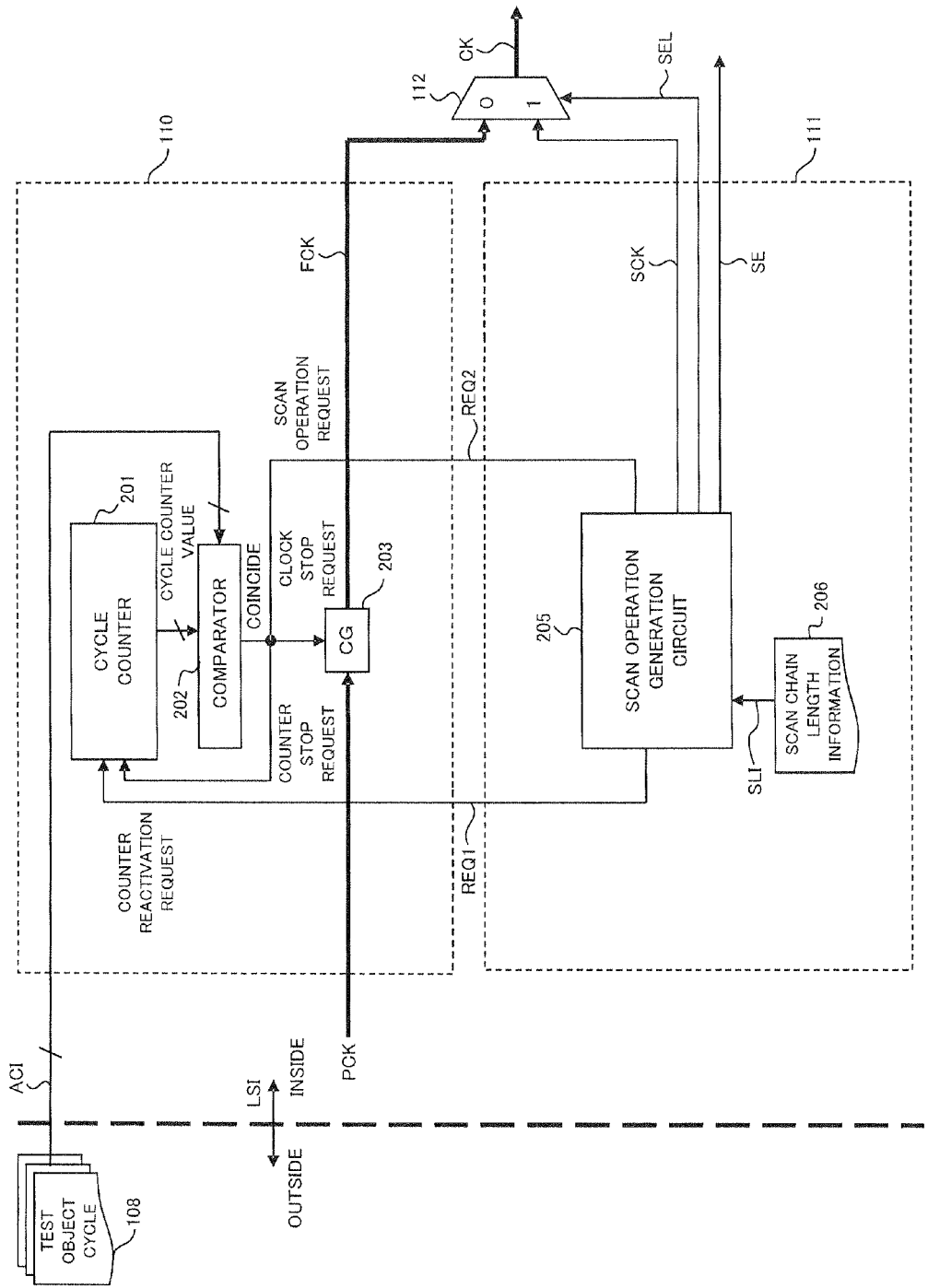
FIG. 5 illustrates a configuration example of an input pattern control circuit and a scan control circuit according to the embodiment.
Figure 8:
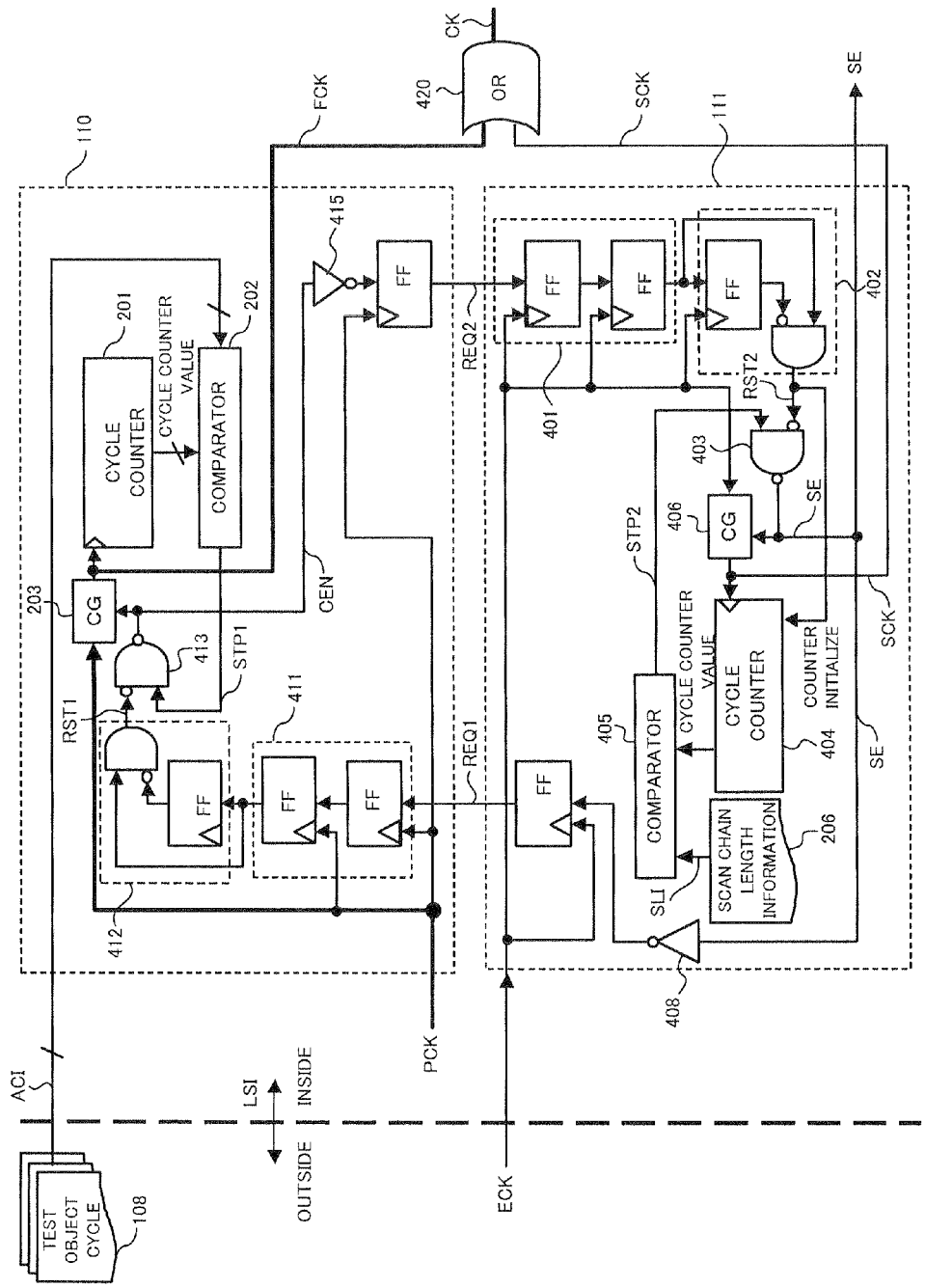
FIG. 8 illustrates a circuit example of the input pattern control circuit and the scan control circuit.

FIG. 8 illustrates the configuration of the input pattern control circuit 110 and the scan control circuit 111 illustrated in FIG. 5 in a further specific circuit form. The input pattern control circuit 110 and the scan control circuit 111 illustrated in FIG. 8 configure an example of "a semiconductor integrated circuit" in the embodiment. The elements and the signals attached with the same reference signs as those in FIG. 5 have the same meaning and the description thereof will be omitted.

The input pattern control circuit 110 mainly includes the cycle counter 201, the comparator 202, the clock gating 203, a synchronization circuit 411, a counter restart request circuit 412 and a clock stop request circuit 413. In this case, the input pattern control circuit 110 corresponds to the input pattern control circuit.

The cycle counter 201 counts the cycle number during the application of the existing input pattern VI, after the start of the logical simulation. The comparator 202 compares the value of the test object cycle ACI with the cycle counter value of the cycle counter 201, and generates the stop signal STP1 in accordance with the comparison result. For example, when these values coincide with each other, the comparator 202 outputs "1" as the stop signal STP1 in order to stop the clock supply to the inside of the LSI 103 and in order to stop the counter of the cycle counter 201.

The synchronization circuit 411 includes two flip-flops, and receives the internal oscillation clock PCK and the cycle counter operation request signal REQ1. The synchronization circuit 411 is the non-synchronization countermeasure circuit prepared on the assumption that the internal oscillation clock PCK is the high-speed clock and the scan clock SCK is the low-speed clock. The counter restart request circuit 412 receives the signal from the synchronization circuit 411, and generates the counter restart request signal RST1. For example, when the edge (change) of the signal supplied from the synchronization circuit 411 is detected, the counter restart request circuit 412 outputs "1" as the counter restart request signal RST1 in order to restart the counter of the cycle counter 201. Basically, the counter restart request circuit 412 temporarily outputs "1" as the counter restart request signal RST1 when the cycle counter operation request signal REQ1 is switched from "0" to "1".

The clock stop request circuit 413 receives the stop signal STP1 and the counter restart request signal RST1, and generates the clock stop request signal CEN. Basically, the clock stop request circuit 413 outputs "0" as the clock stop request signal CEN when "1" is supplied as the stop signal SIP1. This clock stop request signal CEN is inverted by the inverter 415, and the inverted signal is subjected to a certain processing to be supplied to the scan control circuit 111 as the scan operation request signal REQ2.

The clock gating 203 receives the internal oscillation clock PCK and the clock stop request signal CEN, and generates the normal operation clock FCK from the internal oscillation clock PCK in accordance with the clock stop request signal CEN. For example, the clock gating 203 executes clock-gates the internal oscillation clock PCK to generate the normal operation clock FCK when "0" is supplied as the clock stop request signal CEN. The normal operation clock FCK thus generated is supplied to the OR circuit 420. When the clock gating 203 executes the clock-gating, the cycle counter 201 stops the count-up.

On the other hand, the scan control circuit 111 mainly includes a synchronization circuit 401, a counter initialization request circuit 402, a scan selection signal generation circuit 403, a cycle counter 404, a comparator 405, a clock-gating 406 and a chain length information storage unit 206. In this case, the scan control circuit 111 corresponds to the scan control circuit.

The synchronization circuit 401 includes two flip-flops, and receives the external input clock ECK and the scan operation request signal REQ2. The synchronization circuit 401 is the non-synchronization countermeasure circuit prepared on the assumption that the internal oscillation clock PCK is the high-speed clock and the scan clock SCK is the low-speed clock. The counter initialization request circuit 402 receives the signal from the synchronization circuit 401, and generates the counter initialization request signal RST2. For example, the counter initialization request circuit 402 outputs "1" as the counter initialization request signal RST2, in order to initialize the counter of the cycle counter 404, when the edge (change) of the signal supplied from the synchronization circuit 401 is detected. Basically, the counter initialization request circuit 402 temporarily outputs "1" as the counter initialization request signal RST2 when the scan operation request signal REQ2 is switched from "0" to "1".

The cycle counter 404 is a cycle counter for managing the scan operation. For example, when the counter initialization request circuit 402 requests (i.e., "1" is supplied as the counter initialization request signal RST2), the cycle counter 404 initializes the cycle counter value to "1", and increments the cycle counter value thereafter. The comparator 405 compares the cycle number corresponding to the scan chain length information SLI with the cycle counter value of the cycle counter 404, and generates the stop signal STP2 in accordance with the comparison result. For example, when these values coincide with each other, the comparator 405 outputs "1" as the stop signal STP2 in order to stop the supply of the scan clock SCK and in order to stop the counter of the cycle counter 404.

The scan selection signal generation circuit 403 receives the stop signal STP2 and the counter initialization request signal RST2, and generates the scan selection signal SE. Basically, the scan selection signal generation circuit 403 outputs "1", when "1" is supplied as the counter initialization request signal RST2. This scan selection signal SE is inverted by the inverter 408, and the inverted signal is subject to a certain processing to be supplied to the input pattern control circuit 110 as the cycle counter operation request signal REQ1.

The clock gating 406 receives the external input clock ECK and the scan selection signal SE, and generates the scan clock SCK from the external input clock ECK in accordance with the scan selection signal SE. For example, the clock gating 406 clock-gates the external input clock ECK when the scan selection signal SE is "0", and stops the clock-gating when the scan selection signal SE is "1". Namely, the clock gating 406 outputs the external input clock ECK as the scan clock SCK when "1" is supplied as the scan selection signal SE. Since the external input clock ECK is the relatively low-speed clock, by using the external input clock ECK as the scan clock SCK, it becomes easy to access from the outside of the LSI 103 at the time of the scan operation. The scan clock SCK thus generated is supplied to the OR circuit 420. When the clock gating 406 executes the clock-gating, the cycle counter 404 stops the count-up.

The OR circuit 420 corresponds to an example of the above-described clock selection circuit 112. The OR circuit 420 receives the normal operation clock FCK and the scan clock SCK, and generates the internal clock CK in accordance with those clocks. For example, when the normal operation clock FCK is stopped (i.e., when it is fixed to "0"), the OR circuit 420 outputs the scan clock SCK as the internal clock CK. On the contrary, when the scan clock SCK is stopped (i.e., when it is fixed to "0"), the OR circuit 420 outputs the normal operation clock FCK as the internal clock CK. In this way, when the OR circuit 420 executes the sequential operation to operates the logical sum (OR) of the normal operation clock FCK and the scan clock SCK, the clock selection logic can be appropriately realized.

While both the input pattern control circuit 110 and the scan control circuit 111 are implemented inside of the LSI 103 as the hardware in FIG. 8, a part of the function may be implemented as the description on the test bench 102, not as the hardware. However, the input pattern control circuit 110 is preferred to be implemented in the LDI 103 as the hardware. The reason is as follows.

In the recent LSI, a clock oscillated at high-speed by a PLL is frequently used as the internal oscillation clock PCK at the time of the normal operation. On the other hand, the clock frequency that can be used at the time of testing the LSI is determined by the test apparatus, but the frequency is lower than the high-speed oscillation frequency by the PLL in many cases. Therefore, there occurs such a case that the access to the inside of the LSI from the outside of the LSI can be done only by the low frequency, but the inside of the LSI performs the high-speed operation. In this situation, in order to securely stop the cycle counter 201 in the input pattern control circuit 110 at the desired cycle "m", it is desired to make the clock stop request signal CEN operate by the normal operation clock FCK in the test object circuit 104. However, in the LSI test, it is difficult to access from outside of the LSI at very high frequency. Therefore, it is preferable that the input pattern control circuit 110 is implemented inside the LSI 103 as the hardware.

Next, with reference to FIGS. 9 and 10, the description will be given of an example of the operation waveform of the simulation apparatus 100 on which the input pattern control circuit 110 and the scan control circuit 111 illustrated in FIG. 8 are implemented.

Figure 7:
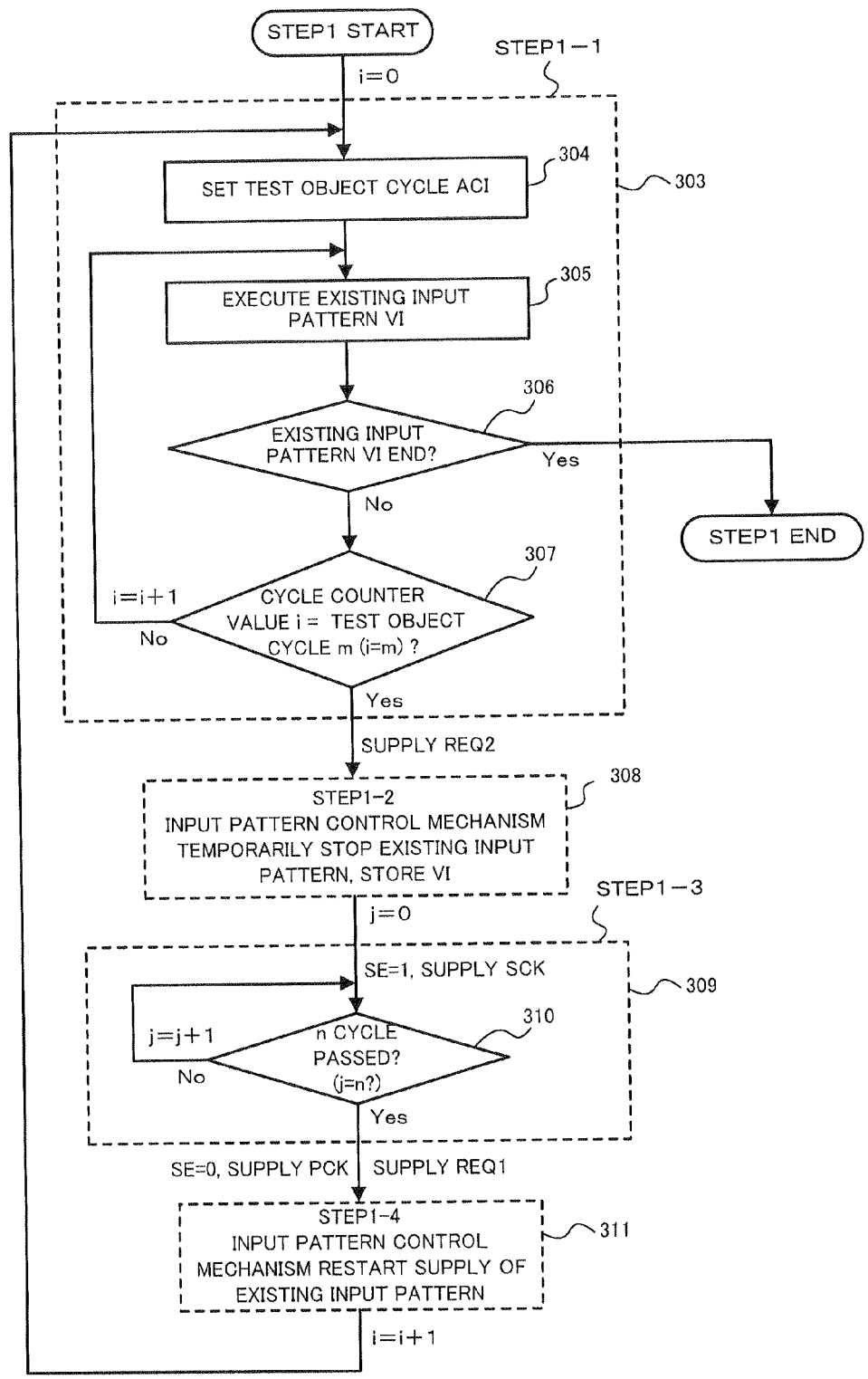
FIG. 7 illustrates a flow illustrating the detail first step STEP1.
Figure 9:
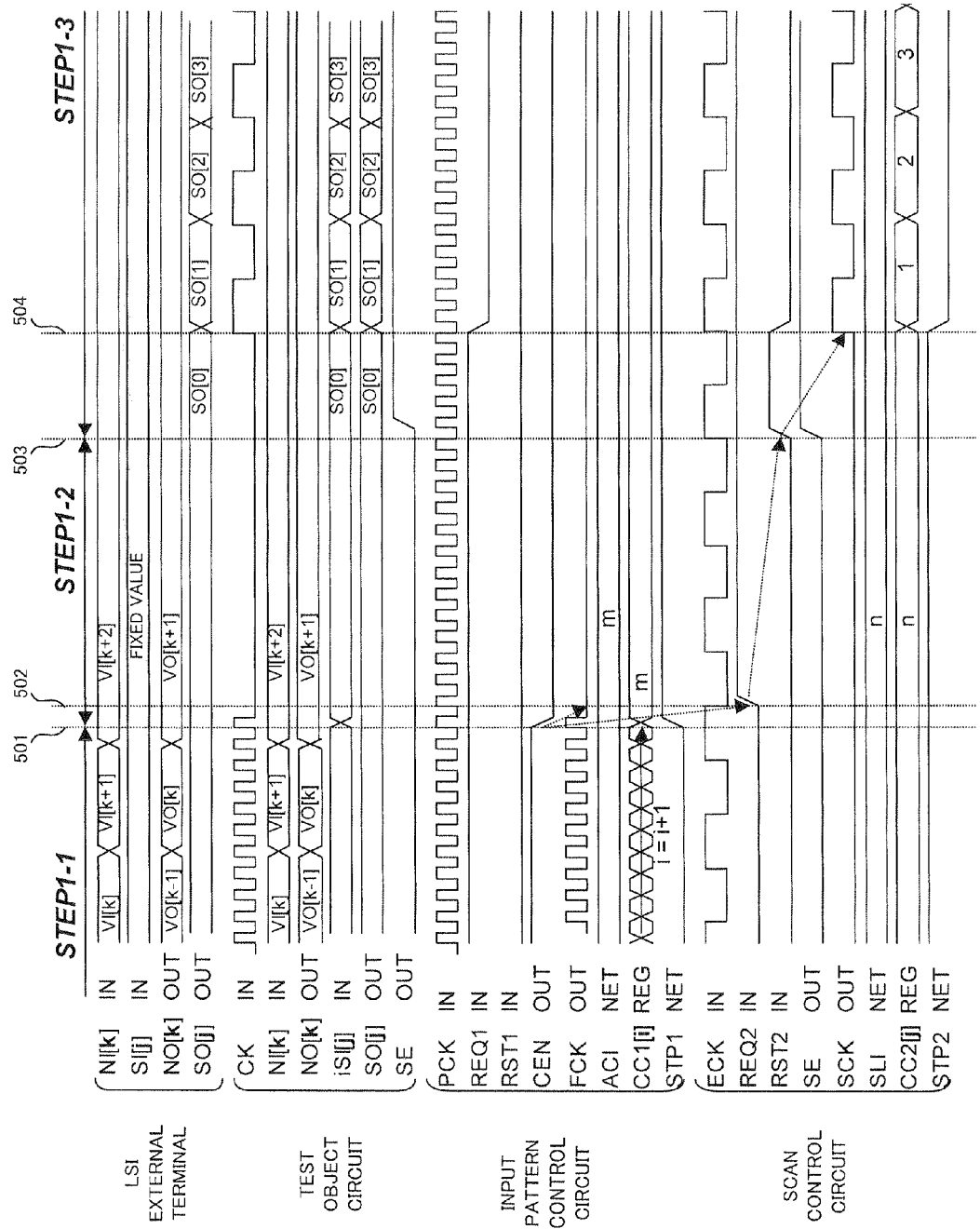
FIG. 9 illustrates an example of operation waveform when steps STEP1-1 to STEP1-3 are executed.

FIG. 9 illustrates the operation waveform when the steps STEP1-1 to STEP1-3 of the flow illustrated in FIG. 7 are executed. In FIG. 9, the cycle counter value of the cycle counter 201 is expressed as "CC1", and the cycle counter value of the cycle counter 404 is expressed as "CC2" (Similar in the following) Other reference signs are as described above.

First, in the cycle 501, during the execution of the step STEP1-1 which inputs the existing input pattern VI, the value "m" of the test object cycle ACI coincides with the cycle counter value "i" of the cycle counter 201. Therefore, the clock stop request signal CEN of the input pattern control circuit 110 changes from "1" to "0". When this change of the clock stop request signal CEN is transmitted to the clock gating 203, the supply of the normal operation clock FCK is stopped, and the count-up of the cycle counter 201 is stopped. Subsequently, in the cycle 502, "1" is supplied to the scan control circuit 111 as the scan operation request signal REQ2 (step STEP1-2).

Subsequently, in the cycle 503, on receiving the scan operation request signal REQ2 by the input pattern control circuit 110, the scan selection signal SE becomes "1" (step STEP1-3). Then, in and after the cycle 504, the operation of the scan clock SCK starts, and the values of the flip-flops FF1 to FF6 are outputted to the outside of the LSI 103 as the scan output signal SO (step STEP1-3). In addition, the scan output signal SO is returned to the flip-flops FF1 to FF6, and the values of the flip-flops FF1 to FF6 are returned to the state before stopping the normal operation, after the shift of the scan chain.

Figure 10:
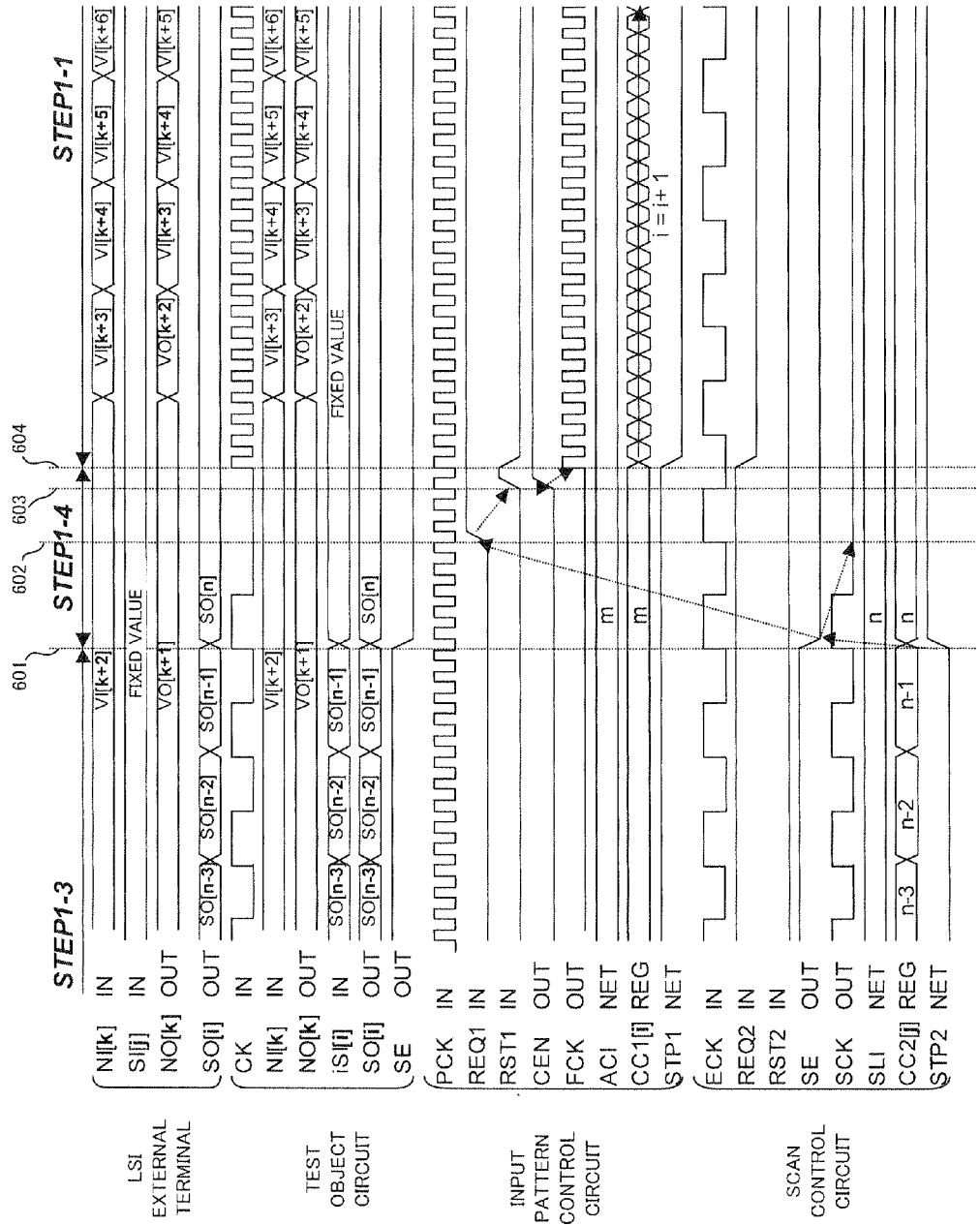
FIG. 10 illustrates an example of operation waveform when the process returns to step STEP1-1 after executing STEP1-3, STEP1-4.

Next, FIG. 10 illustrates the operation waveform when the process returns to the step STEP1-1 after executing the steps STEP1-3, STEP1-4 of the flow illustrated in FIG. 7.

First, in the cycle 601, the cycle counter value "j" of the cycle counter 404 in the scan control circuit 111 coincides with the scan chain length "n" (step STEP1-3). Therefore, the scan selection signal SE becomes "0", and the operation of the scan clock SCK is stopped.

Subsequently, in the cycle 602, "1" is supplied to the input pattern control circuit 110 as the cycle counter operation request signal REQ1 (step STEP1-4). Then, in the cycle 603, on receiving the cycle counter operation request signal REQ1 by the scan control circuit 111, the clock stop request signal CEN changes from "0" to "1" (step STEP1-4). This change of the clock stop request signal CEN is transmitted to the clock gating 203, and the supply of the normal operation clock FCK is restarted.

Therefore, in and after the cycle 604, the existing input pattern VI is inputted, and the normal operation returns. In addition, the count-up of the cycle counter 201 is restarted.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present inventions have been described in detail, it should be understood that the various changes, substitutions, and alterations could be made hereto without departing from the spirit and scope of the invention.

What is claimed is:

1. An integrated circuit comprising:
   an input pattern control circuit which counts a cycle number of an input pattern supplied to a test object circuit, and which stops supply of the input pattern and a first clock to the test object circuit when the cycle number of the input pattern coincides with a certain count number; and
   a scan control circuit which supplies a scan shift signal to the test object circuit to shift a scan chain in the test object circuit based on a control signal from the input pattern control circuit, while the input pattern control circuit stops the supply of the input pattern,
   wherein the scan control circuit applies a second clock having a frequency accessible to the test object circuit from outside, to the test object circuit, for cycles corresponding to a length of the scan chain, after the input pattern control circuit stops the supply of the first clock to the test object circuit.

2. The integrated circuit according to claim 1, further comprising a circuit which performs a control of inputting a value outputted by the test object circuit again to the test object circuit as a scan input, during a shift operation of the scan chain by the scan control circuit.

3. A simulation apparatus comprising:
   an input pattern control unit which counts a cycle number of an input pattern supplied to a test object circuit, and which stops supply of the input pattern and a first clock to the test object circuit when the cycle number of the input pattern coincides with a certain count number; and
   a scan control unit which supplies a scan shift signal to the test object circuit to shift a scan chain circuit in the test object circuit based on a control signal from the input pattern control unit, while the input pattern control unit stops the supply of the input pattern,
   wherein the scan control unit applies a second clock having a frequency accessible to the test object circuit from outside, to the test object circuit, for cycles corresponding to a length of the scan chain, after the input pattern control unit stops the supply of the first clock to the test object circuit.

4. The simulation apparatus according to claim 3, further comprising a unit which performs a control of inputting a value outputted by the test object circuit again to the test object circuit as a scan input, during a shift operation of the scan chain by the scan control unit.

5. A simulation method comprising:
   counting a cycle number of an input pattern supplied to a test object circuit;
   stopping supply of the input pattern and a first clock to the test object circuit when the cycle number of the input pattern coincides with a certain count number;
   supplying a scan shift signal to the test object circuit to shift a scan chain in the test object circuit, while the supply of the input pattern is stopped; and
   applying a second clock having a frequency accessible to the test object circuit from outside, to the test object circuit, for cycles corresponding to a length of the scan chain, after stopping the supply of the first clock to the test object circuit.

6. The simulation method of claim 5 for performing a test by using data obtained by the simulation method, comprising:
   storing the input pattern;
   storing an output of the scan chain as expected value data; and
   performing a test of a semiconductor device by comparing an output value of the semiconductor device when the stored input pattern is inputted to the semiconductor device, with the stored expected value data.

7. The integrated circuit according to claim 1,
   wherein the input pattern is a pattern which operates the test object circuit according to an actual use form.

8. The simulation apparatus according to claim 3,
   wherein the input pattern is a pattern which operates the test object circuit according to an actual use form.

9. The simulation method according to claim 5,
   wherein the input pattern is a pattern which operates the test object circuit according to an actual use form.

10. The simulation method according to claim 5, further comprising inputting a value outputted by the test object circuit again to the test object circuit as a scan input, during a shift operation of the scan chain.

* * * * *